(12) United States Patent
Sundström et al.

(10) Patent No.: US 11,545,989 B2
(45) Date of Patent: Jan. 3, 2023

(54) TIME-INTERLEAVED ANALOG-TO-DIGITAL CONVERTER

(71) Applicant: Telefonaktiebolaget LM Ericsson (publ), Stockholm (SE)

(72) Inventors: Lars Sundström, Södra Sandby (SE); Daniele Mastantuono, Lund (SE); Mattias Palm, Bara (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 190 days.

(21) Appl. No.: 16/771,721

(22) PCT Filed: Dec. 22, 2017

(86) PCT No.: PCT/EP2017/084536
§ 371 (c)(1),
(2) Date: Jun. 11, 2020

(87) PCT Pub. No.: WO2019/120587
PCT Pub. Date: Jun. 27, 2019

(65) Prior Publication Data
US 2020/0373933 A1 Nov. 26, 2020

(51) Int. Cl.
*H03M 1/10* (2006.01)
*G11C 27/02* (2006.01)
*H04W 88/08* (2009.01)

(52) U.S. Cl.
CPC ......... *H03M 1/1009* (2013.01); *G11C 27/026* (2013.01); *H04W 88/08* (2013.01)

(58) Field of Classification Search
USPC .......................................................... 327/90
See application file for complete search history.

(56) References Cited

U.S. PATENT DOCUMENTS 6,433,632 B1 * 8/2002 Nakamura ................ H03F 3/70
327/124
6,700,417 B2 * 3/2004 Kawahito ............ G11C 27/026
327/96
(Continued)

FOREIGN PATENT DOCUMENTS

WO 2016192763 A1 12/2016

OTHER PUBLICATIONS

PCT International Search Report and Written Opinion, dated Oct. 10, 2018 for International Application PCT/EP2017/084536, 10 pages.
(Continued)

Primary Examiner — Thomas J. Hiltunen
(74) Attorney, Agent, or Firm — Sage Patent Group

(57) ABSTRACT

An ADC includes a plurality of sub ADCs configured to operate in a time-interleaved manner and a sampling circuit configured to receive an analog input signal of the ADC, wherein the sampling circuit is common to all sub ADCs. The ADC includes a test signal generation circuit configured to generate a test signal for calibration of the ADC. The sampling circuit has a first input configured to receive the analog input signal and a second input configured to receive the test signal. The sampling circuit includes an amplifier circuit and a first feedback switch connected between an output of the amplifier circuit and an input of the amplifier circuit. The first feedback switch is configured to be closed during a first clock phase and open during a second clock phase, which is non-overlapping with the first clock phase.

17 Claims, 4 Drawing Sheets

(56) References Cited

U.S. PATENT DOCUMENTS

| | | | | |
|---|---|---|---|---|
| 6,756,928 B2* | 6/2004 | Kawahito | ............ | H03F 3/45645 |
| | | | | 341/172 |
| 7,397,287 B2* | 7/2008 | Makihara | ............. | G11C 27/026 |
| | | | | 327/91 |
| 8,193,856 B2* | 6/2012 | Gonzalez | ................. | H03F 1/42 |
| | | | | 330/109 |
| 8,797,196 B2* | 8/2014 | de Figueiredo | ..... | H03M 1/1009 |
| | | | | 341/161 |
| 8,890,987 B2* | 11/2014 | Eshel | .................... | H04N 5/378 |
| | | | | 348/300 |
| 8,902,094 B1* | 12/2014 | Zhang | ................... | H03L 7/0814 |
| | | | | 341/122 |
| 9,030,344 B2* | 5/2015 | Chen | ..................... | H03M 1/187 |
| | | | | 341/155 |
| 9,325,336 B2* | 4/2016 | Mulder | ............... | H03M 1/1014 |
| 9,780,129 B2* | 10/2017 | Eshel | ................... | G11C 27/024 |
| 10,840,933 B2* | 11/2020 | Ali | ....................... | H03M 1/186 |
| 2009/0278716 A1 | 11/2009 | Kawahito et al. | | |
| 2013/0106632 A1* | 5/2013 | Petigny | .............. | H03M 1/1004 |
| | | | | 341/120 |

OTHER PUBLICATIONS

Daihong et al., "A Digital Background Calibration Technique for Time-Interleaved Analog-to-Digital Converters", IEEE Journal of Solid-State Circuits, vol. 33, No. 12, Piscataway NJ, USA, Dec. 1, 1998, p. 1904-1911.

Bang-Sup Song et al., "A 12 bit 1-Msample/s Capacitor Error-Averaging Pipelined A/D Converter", IEEE Journal of Solid-State Circuits, vol. 23, No. 6, Dec. 1988, p. 1324-1333.

\* cited by examiner

TIME-INTERLEAVED ANALOG-TO-DIGITAL CONVERTER

CROSS-REFERENCE TO RELATED APPLICATIONS

This application is a 35 U.S.C. § 371 national stage application for International Application No. PCT/EP2017/084536, entitled "TIME-INTERLEAVED ANALOG-TO-DIGITAL CONVERTER", filed on Dec. 22, 2017, the disclosures and contents of which are hereby incorporated by reference in their entireties.

TECHNICAL FIELD

The present invention relates to the field of time-interleaved analog-to-digital converters.

BACKGROUND

An analog-to-digital converter (ADC) is an interface circuit between the analog and the digital signal processing domain that converts an input signal from an analog representation to a digital representation. ADCs are used in many different types of electronic circuits. For instance, ADCs can be used in receiver circuits for converting a received analog signal to a digital representation, which is then subject to further signal processing in a digital signal processor or the like.

Sample-and-hold circuits are often used as input interface circuits of ADCs. An example of a sample-and-hold circuit is shown in FIG. 15 of the article B-S Song et al, "A 12-bit 1-Msample/s Capacitor Error-Averaging Pipelined A/D Converter," in *IEEE Journal of Solid-State Circuits*, vol. 23, no. 6, pp. 1324-1333, December 1988.

On type of ADC that is commonly used to achieve relatively high sampling rates is the so-called time-interleaved ADC (TI-ADC). A TI-ADC comprises a number M of nominally identical sub ADCs that each operate on every M:th input sample in a time-interleaved manner. If each TI-ADC operates at a sampling rate $f_s$, each sub ADC operates at a considerably lower sampling rate $f_{s,sub}=f_s/M$.

Due to mismatches between sub ADCs in a TI-ADC, such as mismatch in gain and offset, there will be unwanted distortion in the output of the TI-ADC. Several different calibration procedures have been proposed to counteract such distortion. One example is disclosed in Daihong Fu, K. C. Dyer, S. H. Lewis and P. J. Hurst, "A digital background calibration technique for time-interleaved analog-to-digital converters," in *IEEE Journal of Solid-State Circuits*, vol. 33, no. 12, pp. 1904-1911, December 1998 (Fu et al). In Fu et al, background calibration is done by adding a calibration signal to the ADC input and processing both simultaneously. This has the benefit of eliminating the need for an extra parallel sub ADC, or "channel", which is required in some other background calibration techniques.

SUMMARY

The inventors have developed handy circuitry for adding such a calibration signal, referred to in this disclosure as a test signal, to the input signal of a TI-ADC.

According to a first aspect, there is provided an ADC. The ADC comprises a plurality of sub ADCs configured to operate in a time-interleaved manner and a sampling circuit configured to receive an analog input signal of the ADC, wherein the sampling circuit is common to all sub ADCs. The ADC further comprises a test signal generation circuit configured to generate a test signal for calibration of the ADC. The sampling circuit has a first input configured to receive the analog input signal and a second input configured to receive the test signal. The sampling circuit comprises an amplifier circuit and a first feedback switch connected between an output of the amplifier circuit and an input of the amplifier circuit. The first feedback switch is configured to be closed during a first clock phase and open during a second clock phase, which is non-overlapping with the first clock phase. Furthermore, the sampling circuit comprises an input circuit comprising one or more capacitors, each having a first node and a second node. Moreover, the sampling circuit comprises sampling switches connecting the first and second inputs with nodes of capacitors in the input circuit to sample the analog input signal and the test signal represented as electrical charges on capacitors in the input circuit. Each of the capacitors in the input circuit is configured to be connected with its second node to said input of the amplifier circuit during the second clock phase. The sampling circuit comprises a second feedback switch connected between the output of the amplifier circuit and the first node of at least one of the capacitors in the input circuit, wherein the second feedback switch is configured to be closed during the second clock phase and open during the first clock phase.

In some embodiments, the input circuit comprises a first capacitor and a second capacitor, where the second node of the first capacitor is directly connected to said input of the amplifier circuit and the second node of the second capacitor is directly connected to said input of the amplifier circuit. The second feedback switch may be connected to the first node of the first capacitor. The sampling circuit may comprise a first sampling switch connected between the first input and the first node of the first capacitor and configured to be closed during the first clock phase and open during the second clock phase. The sampling circuit may comprise a second sampling switch connected between the second input and the first node of the second capacitor. In some of these embodiments, the second sampling switch is configured to be closed during the first clock phase and open during the second clock phase, and the sampling circuit comprises a reset switch that is connected between the first node of the second capacitor and a signal ground node and configured to be closed during the second clock phase and open during the first clock phase. In other of these embodiments, the second sampling switch is configured to be closed during the second clock phase and open during the first clock phase, and the sampling circuit comprises a third sampling switch connected between the first node of the second capacitor and the first input, which is configured to be closed during the first clock phase and open during the second clock phase.

In some embodiments, the sampling circuit comprises, for each capacitor in the input circuit, a switch connected between the second node of that capacitor and said input of the amplifier circuit, wherein the switch is configured to be closed during the second clock phase and open during the first clock phase. The input circuit may comprise a first capacitor. The sampling circuit may comprise a first sampling switch connected between the first input and the first node of the first capacitor, and configured to be closed during the first clock phase and open during the second clock phase. The sampling circuit may comprise a second sampling switch connected between the second input and the second node of a capacitor in the input circuit, in the following referred to as the test-signal sampling capacitor. The second sampling switch may be configured to be closed during the first clock phase and open during the second clock phase. In some of these embodiments the first capacitor is the test-signal sampling capacitor. In other of these embodiments, the input circuit comprises a second capacitor, which is the test-signal sampling capacitor. The sampling circuit may comprise a first reset switch connected between the second node of the first capacitor and a signal ground node. The sampling circuit may comprise a second reset switch connected between the first node of the second capacitor and a signal ground node. The sampling circuit may comprise a third sampling switch connected between the first input and the first node of the second capacitor. The first reset switch may be configured to be closed during the first clock phase and open during the second clock phase. The second reset switch may be configured to be closed during the second clock phase and open during the first clock phase.

As a non-limiting example, the test signal may be a pseudo-random binary sequence.

According to a second aspect, there is provided a receiver circuit that comprises the ADC of the first aspect.

According to a third aspect, there is provided an electronic apparatus comprising the ADC of the first aspect. For example, the electronic apparatus may comprise the receiver circuit of the second aspect. The electronic apparatus may e.g. be a communication apparatus, such as a wireless communication device or a base station for a cellular communications system.

It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
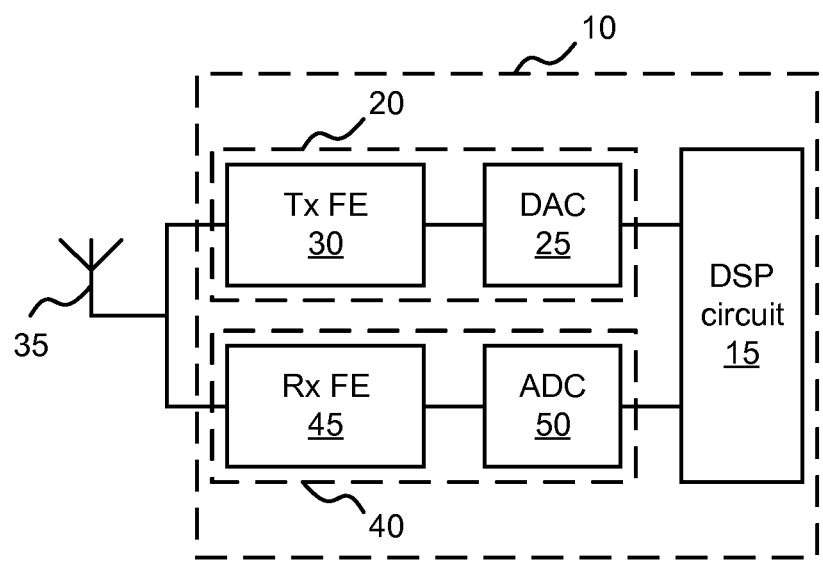
FIG. 2 is a block diagram of a receiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The transmitter circuit 20 also comprises a transmitter (Tx) frontend (FE) circuit 30 connected between the DAC 25 and an antenna 35. The Tx FE circuit 30 is configured to transform the output signal from the DAC 25 to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. The ADC 50 is connected between the Rx FE circuit 45 and the DSP circuit 15. The Rx FE circuit is 45 is configured to is transform a signal received via the antenna 35 to a format suitable to be input to the ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The ADC 50 is configured to receive its (analog) input signal from the Rx FE circuit, and convert it to a digital representation to generate the digital output signal of the ADC 50. This digital output signal of the ADC 50 is input to the DSP circuit 15 for further digital signal processing.

Figure 3:
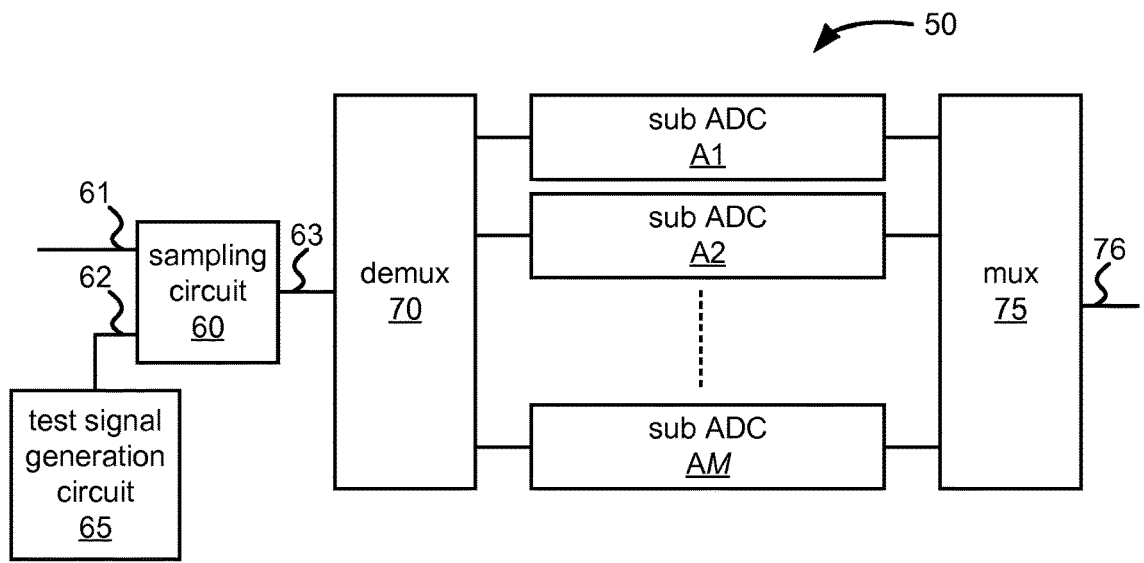
FIG. 3 is a block diagram of a time-interleaved ADC.

FIG. 3 is a block diagram of the ADC 50 according to some embodiments. The ADC 50 may, for instance, be integrated on an integrated circuit. It comprises a plurality of sub ADCs A1-AM configured to operate in a time-interleaved manner. The integer M denotes the number of sub ADCs A1-AM. The sub ADCs A1-AM may be of any suitable kind, such as but not limited to successive approximation ADCs or pipelined ADCs.

Furthermore, the ADC 50 comprises a sampling circuit 60 configured to receive an analog input signal of the ADC 50. The sampling circuit 60 is common to all sub ADCs A1-AM. Moreover, the ADC 50 comprises a test signal generation circuit 65 configured to generate a test signal for calibration of the ADC 50. The test signal may for example be a pseudo-random binary sequence. There are many different known circuits that generate such pseudo-random binary sequences. The design of such circuits are therefore not further described herein. Alternatively, any other type of signal may be used as a test signal. The test signal generation circuit may then for instance comprise a look-up table or other memory (not shown) for storing samples of the test signal and a DAC for generating the test signal based on the stored samples.

The sampling circuit 60 has a first input 61 configured to receive the analog input signal. Furthermore, the sampling circuit 60 has a second input 62 configured to receive the test signal. Details of embodiments of the sampling circuit 60 are further described below. In FIG. 3, the sampling circuit 60 has an output 63 configured to output a sequence of samples of a signal, which is a combination of the analog input signal of the ADC 50 and the test signal. In some embodiments, said combination is a sum or difference. In some embodiments, said combination is a weighted sum or difference. Below, the sequence output from the sampling circuit 60 is denoted v(n), where n is an integer valued sequence index that indicates an n:th sampling instant. If the analog signal is represented with a voltage $v_{in}(n)$ at said n:th sampling instant, and the test signal is represented with a voltage $v_{test}(n)$ at said n:th sampling instant, then v(n) can, according to some embodiments, be written as $$v(n) = w_1 v_{in}(n) \pm w_2 v_{test}(n) \quad (1)$$

where $w_1$ and $w_2$ are weights, which could be equal (e.g. both equal to 1), in case of a "regular" sum or difference, or unequal in case of a weighted sum or difference. The sign ± should be interpreted as either +, in case of a sum or weighted sum, or as −, in case of a difference or weighted difference.

The main principles of time-interleaved analog-to-digital conversion are well known to persons skilled in the art of data converter design and is not described herein in any greater detail. Basically, the sub ADCs A1-AM take turn in converting the samples v(n) output from the sampling circuit 60 to a digital representation. The individual sub ADCs A1-AM can thus operate at a considerably lower sampling rate than the ADC 50. For example, as indicated in FIG. 3, the ADC 50 may comprise a demultiplexer 70 that is configured to forward the output samples from the sampling circuit 60 to the individual sub ADCs A1-AM in the correct order. The ADC 50 may further, also as indicated in FIG. 3, comprise a multiplexer 75 configured to interleave the outputs from the individual sub ADCs A1-AM in the correct order in order to form a combined output sequence from the sub ADCs A1-AM, which is the output from the ADC 50, at an output 76 of the multiplexer 75. In an example embodiment, the sub ADCs are operated in an order such that, for k=1, 2, . . . , M, the sub ADC Ak is configured to convert every Mth sample $v_k(m) = v(Mm+k)$ of the input sample sequence $v_{in}(n)$ of the ADC 50, where $v_k(m)$ denotes the input sequence of the sub ADC Ak and m is an integer valued sequence index. In this example embodiment, every individual sub ADC A1-AM operates at a sampling rate that is 1/M times the overall sampling rate of the ADC 50.

This disclosure describes a number of switches in different embodiments. To simplify for the reader to keep track of which switch is which, these are labeled with different names; feedback switch, sampling switch, and reset switch. This is the sole purpose of using different names for the switches. The names do not imply any particular constitution or operation of these switches, but these may be implemented in any suitable way. For example, each switch may be implemented with one or more transistors, such as but not limited to field-effect transistors, in manners that would be understood by a person skilled in the art of electronic circuit design. Furthermore, in analyses in this disclosure, reference is made to electrical charges and voltages that represent signals (or sums or differences of signal). The term "represent" in the analyses means that said charge or voltage is proportional to said signal, possibly with an added offset depending on how reference electrical potentials are selected.

Figure 4:
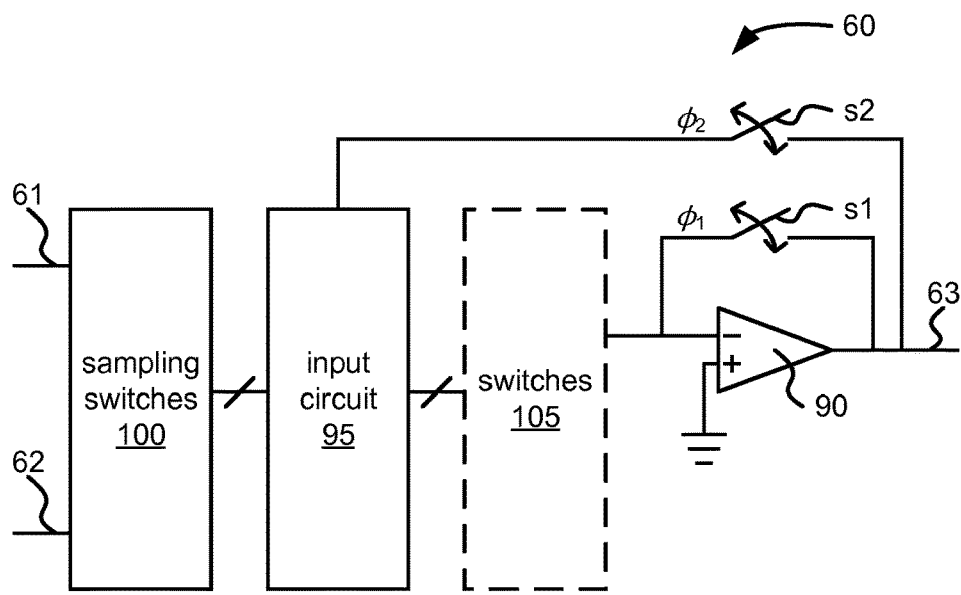
FIG. 4 illustrates embodiments of a sampling circuit.

FIG. 4 is a block diagram of the sampling circuit 60 according to some embodiments. In FIG. 4, the sampling circuit 60 comprises an amplifier circuit 90. As indicated in FIG. 4, the amplifier circuit may be a differential amplifier, such as an operational amplifier or operational transconductance amplifier, having a positive input and a negative input. Furthermore, in some embodiments, the differential amplifier may have one of its inputs connected to a signal ground node, i.e. a node configured to be supplied with a constant electrical potential. What is considered to be zero electrical potential can be arbitrarily chosen. For the sake of simplifying the analysis, the signal ground nodes referred to in this description are assumed to have zero electrical potential. Voltages representing signals may assume positive as well as negative values with reference to this selected zero electrical potential. Also for the sake of simplifying the analysis, the differential amplifier shown in the figures is assumed to have infinite gain, which is a common idealization for analyzing electronic circuitry. In practice, an amplifier has finite gain. It is routine work for a person skilled in the art of analog circuit design to design an amplifier with sufficiently high gain for a given application.

Figure 5:
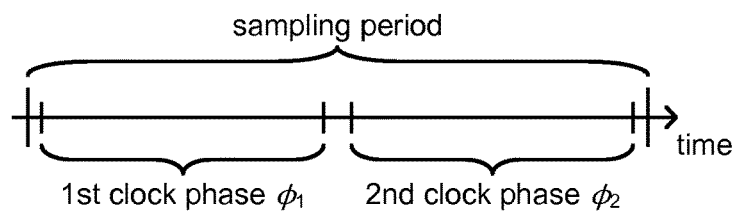
FIG. 5 is a diagram illustrating clock phases.

FIG. 5 is a diagram that illustrates different time intervals that are used in this disclosure. The diagram shows one sampling period of the of the sampling circuit 60, but is applicable to each sampling period. The diagram further refers to two non-overlapping sub intervals, or phases, of the sampling period. These are referred to as a first clock phase, or $\phi_1$, and a second clock phase, or $\phi_2$. Operation of switches are described in this disclosure in terms of the states, such as open or closed, of the switches during the two clock phases. How each switch transitions from one state to the other between the first clock phase and the second clock phase or between the second clock phase and the first clock phase of the subsequent sampling period, is not explicitly discussed in this disclosure. A person skilled in the art of electronic circuit design would be capable of realizing how different switches should be operated in order to avoid malfunction of the circuit. For instance, for two switches that are connected to the same node and that should not be closed simultaneously in order to avoid an unwanted short circuit between two nodes, the skilled person would recognized that one of the switches should be opened before the other is closed. Furthermore, it is within the normal capability of the skilled person to use simulation tools to verify the correct functionality, and if necessary to modify the timing of switch transitions between the clock phases to avoid malfunction of the circuit.

As a guide to the reader, an indication "C" is included in the figures to the left of each switch that is configured to be closed during the first clock phase. Similarly, an indication "$\phi_2$" is included in the figures to the left of each switch that is configured to be closed during the second clock phase.

Now return to FIG. 4. In FIG. 4, the sampling circuit comprises a feedback switch s1 connected between an output of the amplifier circuit 90 and an input of the amplifier circuit 90. In the description of FIG. 4, it is assumed that the differential amplifier has a positive gain, and said input of the amplifier is therefore the negative input, to ensure negative feedback, whereas the positive input of the differential amplifier is the one connected to signal ground. The feedback switch s1 is configured to be closed during the first clock phase and open during the second clock phase. The sampling circuit 60 further comprises a sub circuit 95, which in the following is referred to as an input circuit 95. The input circuit 95 comprises one or more capacitors, each having a first node and a second node. In the drawings (FIGS. 6-9), the capacitors of the input circuit 95 have been oriented such that the first node is to the left and the second node is to the right.

The sampling circuit 60 comprises sampling switches, collectively shown as a box 100 in FIG. 4, connecting the first and second inputs 61, 62 with nodes of capacitors C1, C2 in the input circuit 95 to sample the analog input signal and the test signal represented as electrical charges on capacitors in the input circuit 95.

According to embodiments of the present disclosure, each of the capacitors in the input circuit 95 is configured to be connected with its second node to the above-mentioned input of the amplifier circuit 90 during the second clock phase. In some embodiments, as further described below, the second node of some or all capacitors of the input circuit 95 may be directly connected, or "hardwired", to the input of the amplifier. In some embodiments, as also further described below, the second node of some or all capacitors of the input circuit 95 may be connected via switches, depicted in FIG. 4 with a box 105, that are closed during the second clock phase.

As illustrated in FIG. 4, the sampling circuit 60 also comprises a feedback switch s2. The feedback switch s2 is connected between the output of the amplifier circuit and the first node of at least one of the capacitors in the input circuit 95. The feedback switch s2 is configured to be closed during the second clock phase, and open during the first clock phase.

Figure 6:
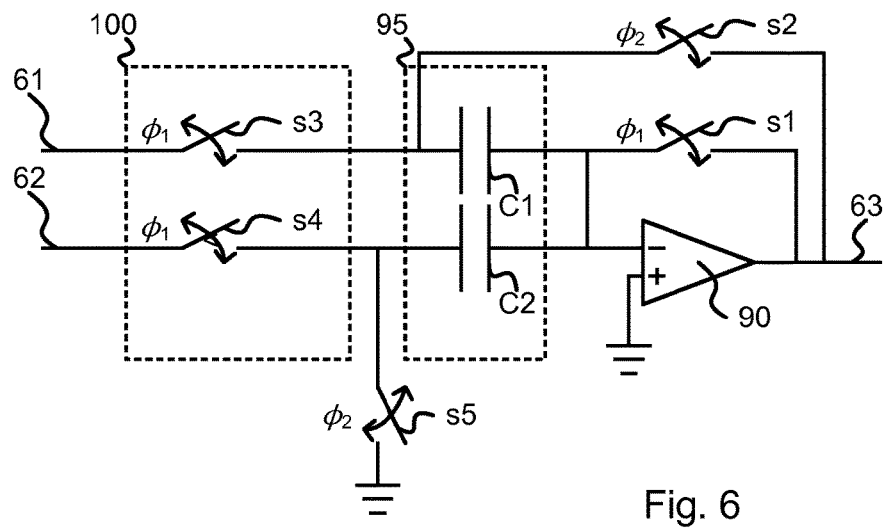
FIGS. 6-9 illustrate embodiments of a sampling circuit.
Figure 7:
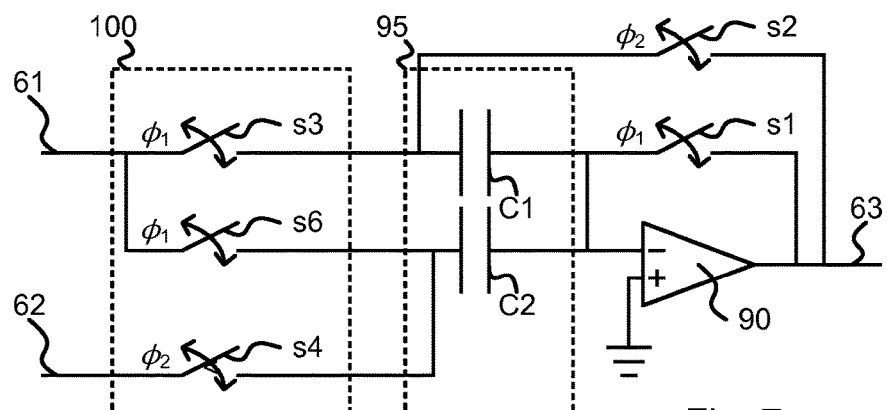

According to some embodiments, the input circuit 95 comprises a first capacitor C1 and a second capacitor C2, wherein the second node of the first capacitor C1 is directly connected to said input of the amplifier and the second node of the second capacitor C2 is directly connected to said input of the amplifier. Examples of such embodiments are depicted in FIGS. 6 and 7. In FIGS. 6 and 7, the feedback switch s2 is connected to the first node of the first capacitor C1. Furthermore, In FIGS. 6 and 7, the sampling circuit 60 comprises a sampling switch s3 connected between the first input 61 and the first node of the first capacitor C1, and a sampling switch s4 connected between the second input 62 and the first node of the second capacitor C2. Moreover, in the embodiments illustrated in FIGS. 6 and 7, the sampling switch s3 is configured to be closed during the first clock phase and open during the second clock phase. During the first clock phase, the analog input signal is therefore sampled on the first capacitor C1.

In the embodiment illustrated in FIG. 6, the sampling switch s4 is also configured to be closed during the first clock phase and open during the second clock phase. During the first clock phase, the test signal is therefore sampled on the second capacitor C2. The sampling circuit 60 also comprises a reset switch s5 connected between the first node of the second capacitor C2 and a signal ground node. The reset switch s5 is configured to be closed during the second clock phase and open during the first clock phase.

Since the feedback switch s1 is open during the second clock phase, the total charge on the first capacitor C1 and the second capacitor C2 is preserved during the second clock phase. Due to the feedback configuration of the amplifier circuit 90, the voltage across the input terminals of the differential amplifier is (ideally) driven to zero, which means that there is a zero voltage across the second capacitor C2. Thus, the total charge sampled on both the first capacitor C1 and the second capacitor C2 during the first clock phase is distributed to only the first capacitor C1 during the second clock phase. The voltage across C1, which is output on the output 63, thus represents a sum of the analog input signal and the test signal. If the capacitances of the capacitors C1 and C2 are equal, said sum is a regular sum. If the capacitances of the capacitors C1 and C2 are different, said sum is a weighted sum.

A skilled person would recognize that the topology of the circuit in FIG. 6 could be varied in various ways while retaining the same functionality. For example, in some embodiments, the feedback switch s2 could be connected to the first node of the second capacitor C2 instead, and the reset switch could be connected to the first node of the first capacitor C1 instead.

In the embodiment illustrated in FIG. 7, the sampling circuit 60 comprises a sampling switch s6 connected between the first node of the second capacitor C2 and the first input 61. The sampling switch s6 is configured to be closed during the first clock phase and open during the second clock phase. During the first clock phase, the analog input signal is therefore sampled on both the first capacitor C1 and the second capacitor C2. In the embodiment illustrated in FIG. 7, the sampling switch s4 is configured to be closed during the second clock phase and open during the first clock phase (i.e. the opposite operation to that in FIG. 6). Thus, in the embodiment illustrated in FIG. 7, the test signal is sampled on the second capacitor C2 during the second clock phase instead. It should be noted though that the test signal is a generated signal, so the circuit designer has full control over when the test signal changes its value. For example, the test signal can adopt a constant value over the whole sampling period, whereby it does not matter whether it is sampled during the first or the second clock phase.

Similar to the description above referring to FIG. 6, since the feedback switch s1 is open during the second clock phase, the total charge on the first capacitor C1 and the second capacitor C2 is preserved during the second clock phase. This total charge is proportional to the (current sample of the) analog input signal, and has no contribution from the test signal. Due to the feedback configuration of the amplifier circuit 90, the voltage across the input terminals of the differential amplifier is (ideally) driven to zero. The charge on the second capacitor C2 is proportional to the (current sample of the) test signal. Thus, the charge on the first capacitor C1 equals the total charge sampled on both the first capacitor C1 and the second capacitor C2 during the first clock phase minus the charge currently stored on the second capacitor. The charge on the second capacitor C2 is proportional to the (current sample of the) test signal. The voltage across C1, which is output on the output 63, thus represents a difference between the analog input signal and the test signal. If the capacitances of the capacitors C1 and C2 are equal, said difference is a weighted difference where the weight of the input signal is twice that of the test signal. If the capacitances of the capacitors C1 and C2 are different, other weights are obtained as would be recognized by a person skilled in electronic circuit design.

Figure 8:
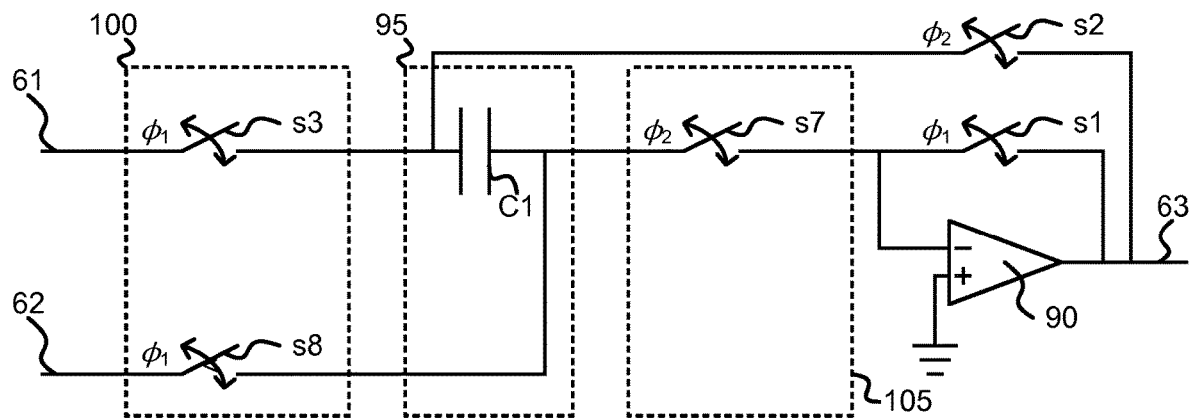
Figure 9:
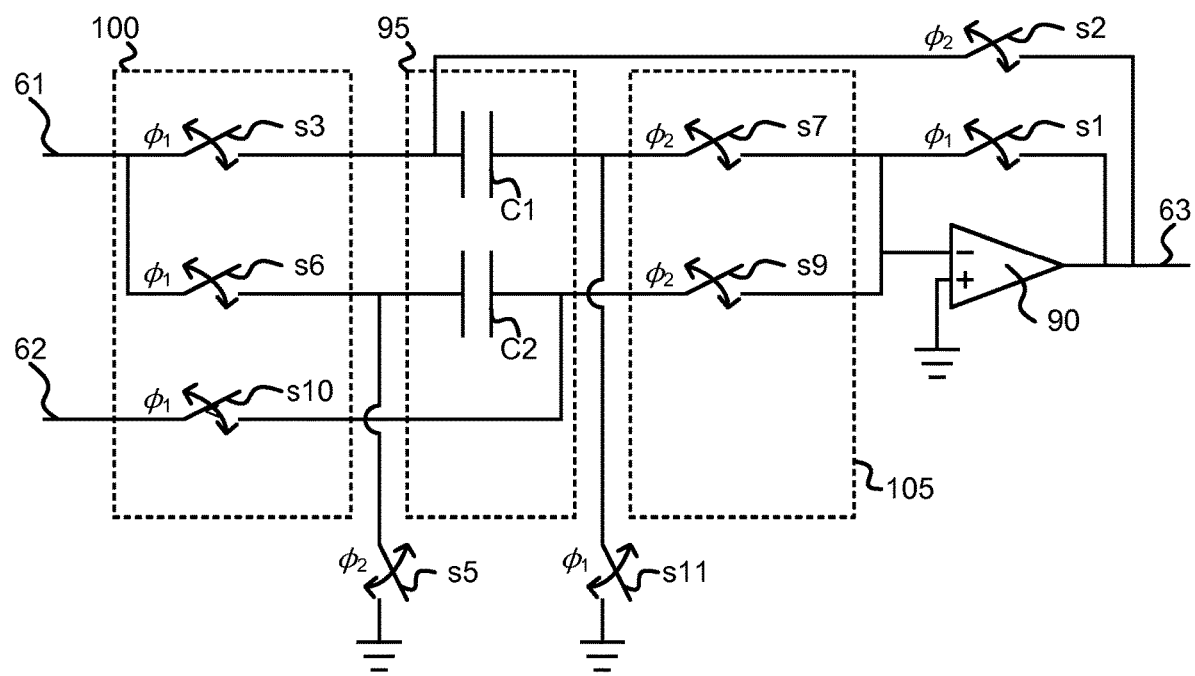

As mentioned above with reference to FIG. 4, the sampling circuit 60 may comprise a set of switches 105 connected between the second node of capacitors in the input circuit 95 and the amplifier circuit 90. According to some embodiments, for each capacitor in the input circuit 95, the set of switches 105 comprises a switch connected between the second node of that capacitor and said input of the amplifier circuit 90. The switches in the set of switches 105 are configured to be closed during the second clock phase and open during the first clock phase. FIGS. 8 and 9 show examples of such embodiments.

In FIGS. 8 and 9, the input circuit 95 comprises a first capacitor C1. Furthermore, the sampling circuit 60 comprises a first sampling switch s3 connected between the first input 61 and the first node of the first capacitor C1. This is similar to the connections in FIGS. 6 and 7, which is why the same reference signs C1 and s3 are used. The sampling switch s3 is configured to be closed during the first clock phase and open during the second clock phase. Furthermore, the sampling circuit 60 comprises a second sampling switch connected between the second input 62 and the second node of a capacitor in the input circuit 95. In the following, that capacitor is referred to as the test-signal sampling capacitor. The second sampling switch is configured to be closed during the first clock phase and open during the second clock phase. As in FIGS. 6 and 7, the feedback switch s2 is connected to the first node of the first capacitor C1 in FIGS. 8 and 9. Furthermore, the set of switches 105 comprises a switch s7 connected between the second node of the first capacitor C1 and the aforementioned input of the amplifier circuit 90.

In FIG. 8, the test-signal sampling capacitor is the first capacitor C1. Furthermore, the second sampling switch is denoted with the reference sign s8. During the first clock phase, a difference between the analog input signal and the test signal is sampled on the first capacitor C1. Furthermore, the voltage at the input of the amplifier circuit 90 is driven to zero (or "signal ground") by means of the feedback configuration of the differential amplifier and the closed feedback switch s1.

During the second clock phase, the charge on the first capacitor C1 is preserved, and thus represents said difference between the analog input signal and the test signal sampled during the first clock phase. Due to the feedback configuration obtained by closing the feedback switch s2, the voltage at the input of the amplifier circuit 90 is driven to zero, so the voltage at the output 63 is the voltage across the capacitor C1, which represents the difference between the analog input signal and the test signal.

In FIG. 9, the input circuit 95 comprises a second capacitor C2, which is the test-signal sampling capacitor. Furthermore, the sampling circuit 60 comprises a third sampling switch s6 connected between the first input 61 and the first node of the second capacitor C2. This is similar to the connections in FIG. 7, which is why the same reference signs C2 and s6 are used. The third sampling switch s6 is configured to be closed during the first clock phase and open during the second clock phase. The second sampling switch is denoted with reference sign s10. The set of switches 105 comprises a switch s9 connected between the second node of the second capacitor C2 and the aforementioned input of the amplifier circuit 90.

In FIG. 9, the sampling circuit 60 comprises a reset switch s11 connected between the second node of the first capacitor C1 and a signal ground node. Furthermore, the sampling circuit 60 comprises a reset switch s5 connected between the first node of the second capacitor C2 and a signal ground node. This connection is similar to that of FIG. 6, which is why the same reference sign s5 is used. The reset switch s11 is configured to be closed during the first clock phase and open during the second clock phase. The reset switch s5 is configured to be closed during the second clock phase and open during the first clock phase.

During the first clock phase, the analog input signal is sampled on the first capacitor C1. Furthermore, a difference between the analog input signal and the test signal is sampled on the second capacitor C2. Moreover, the voltage at the input of the amplifier circuit 90 is driven to zero (or "signal ground") by means of the feedback configuration of the differential amplifier and the closed feedback switch s1.

During the second clock phase, the total charge on the first capacitor C1 and the second capacitor C2 is preserved. This total charge represents a weighted difference between the analog input signal and the test signal sampled during the first clock phase. The weights depend on the capacitance values of the capacitors C1 and C2. Due to the feedback configuration obtained by closing the feedback switch s2, the voltage at the input of the amplifier circuit 90 is driven to zero. Since the reset switch s5 is closed, the charge on the second capacitor C2 is zero, so the above-mentioned total charge on capacitors C1 and C2 is distributed only to the first capacitor C1. Therefore, the voltage across the first capacitor C1, which is output on the output 63, represents the above-mentioned weighted difference between the analog input signal and the test signal.

Above, embodiments of handy circuitry that in an efficient manner combines an analog input signal with a test signal, either as a weighted or non-weighted sum or difference, of a time-interleaved ADC 50 is disclosed. The circuitry makes use of a combined sampling circuit 60 that samples both the analog input signal and the test signal, that can be implemented with relatively little overhead in terms of circuit components and/or power consumption compared with a sampling circuit that only samples the analog input signal.

Gain differences between sub ADCs A1-AM can e.g. be calibrated (to be removed or at least decreased) using the procedures described in the document Fu et al referred to in the background section. Alternatively, other methods may be used as well. For example, the gains of the sub ADCs A1-AM can be estimated in the digital domain in a DSP circuit by correlating the outputs of the sub ADCs with the test signal. Said DSP circuit may e.g. be the DSP circuit 15 (FIG. 2), or a DSP circuit (not shown) comprised within the ADC 50. The contribution of the test signal to the output signal of the ADC 50 can be removed in the digital domain, e.g. in said DSP circuit. In some embodiments, the sub ADCs A1-AM may have variable gains. The gain differences can be calibrated (to be removed or at least decreased) by tuning the gains of the individual sub ADCs A1-AM. In some embodiments, the gain differences can be compensated for in the digital domain, e.g. in said DSP circuit, for instance by multiplying the output signals from the individual sub ADCs A1-AM with correction coefficients. The correction coefficients can be determined based on the estimated gains in order to compensate for the gain differences. For example, the correction coefficient for a given sub ADC Ai can be selected inversely proportional to the estimated gain of that sub ADC.

The disclosure above refers to specific embodiments. However, other embodiments than the above described are possible within the scope of the invention. For example, the ADC 50 may be used in other types of electronic apparatuses than communication apparatuses. Furthermore, the embodiments described show single-ended circuitry, but circuitry making use of differential signal paths may be used as well. The different features of the embodiments may be combined in other combinations than those described.

The invention claimed is:

1. An analog-to-digital converter (ADC), comprising:
a plurality of sub ADCs configured to operate in a time-interleaved manner;
a sampling circuit configured to receive an analog input signal of the ADC, wherein the sampling circuit is common to all sub ADCs;
a test signal generation circuit configured to generate a test signal for calibration of the ADC; wherein
the sampling circuit has a first input configured to receive the analog input signal and a second input configured to receive the test signal;
the sampling circuit comprises an amplifier circuit and a first feedback switch connected between an output of the amplifier circuit and an input of the amplifier circuit, wherein the first feedback switch is configured to be closed during a first clock phase and open during a second clock phase, which is non-overlapping with the first clock phase;
the sampling circuit comprises an input circuit comprising one or more capacitors, each having a first node and a second node;
the sampling circuit comprises sampling switches connecting the first and second inputs with nodes of capacitors in the input circuit to sample the analog input signal and the test signal represented as electrical charges on capacitors in the input circuit;
each of the capacitors in the input circuit is configured to be connected with its second node to said input of the amplifier circuit during the second clock phase; and
the sampling circuit comprises a second feedback switch connected between the output of the amplifier circuit and the first node of at least one of the capacitors in the input circuit, wherein the second feedback switch is configured to be closed during the second clock phase and open during the first clock phase,
wherein, for each capacitor in the input circuit, the sampling circuit comprises:
a switch connected between the second node of that capacitor and said input of the amplifier circuit, wherein the switch is configured to be closed during the second clock phase and open during the first clock phase.

2. The ADC of claim 1, wherein
the input circuit comprises a first capacitor and a second capacitor;
the second node of the first capacitor is directly connected to said input of the amplifier circuit; and
the second node of the second capacitor is directly connected to said input of the amplifier circuit.

3. The ADC of claim 2, wherein the second feedback switch is connected to the first node of the first capacitor.

4. The ADC of claim 2, wherein
the sampling circuit comprises a first sampling switch connected between the first input and the first node of the first capacitor; and
the sampling circuit comprises a second sampling switch connected between the second input and the first node of the second capacitor.

5. The ADC of claim 4, wherein the first sampling switch is configured to be closed during the first clock phase and open during the second clock phase.

6. The ADC of claim 5, wherein
the second sampling switch is configured to be closed during the first clock phase and open during the second clock phase;
the sampling circuit comprises a reset switch connected between the first node of the second capacitor and a signal ground node; and
the reset switch is configured to be closed during the second clock phase and open during the first clock phase.

7. The ADC of claim 5, wherein
the second sampling switch is configured to be closed during the second clock phase and open during the first clock phase;
the sampling circuit comprises a third sampling switch connected between the first node of the second capacitor and the first input; and
the third sampling switch is configured to be closed during the first clock phase and open during the second clock phase.

8. The ADC of claim 1, wherein
the input circuit comprises a first capacitor;
the sampling circuit comprises a first sampling switch connected between the first input and the first node of the first capacitor;
the sampling circuit comprises a second sampling switch connected between the second input and the second node of a capacitor in the input circuit, in the following referred to as the test-signal sampling capacitor;
the first sampling switch is configured to be closed during the first clock phase and open during the second clock phase; and
the second sampling switch is configured to be closed during the first clock phase and open during the second clock phase.

9. The ADC of claim 8, wherein the first capacitor is the test-signal sampling capacitor.

10. The ADC of claim 8, wherein the input circuit comprises a second capacitor, which is the test-signal sampling capacitor.

11. The ADC of claim 10, wherein
the sampling circuit comprises a first reset switch connected between the second node of the first capacitor and a signal ground node;
the sampling circuit comprises a second reset switch connected between the first node of the second capacitor and a signal ground node;
the sampling circuit comprises a third sampling switch connected between the first input and the first node of the second capacitor;
the first reset switch is configured to be closed during the first clock phase and open during the second clock phase; and
the second reset switch is configured to be closed during the second clock phase and open during the first clock phase.

12. The ADC of claim 1, wherein the test signal is a pseudo-random binary sequence.

13. A receiver circuit comprising the ADC of claim 1.

14. An electronic apparatus comprising an analog-to-digital converter (ADC), comprising:
a plurality of sub ADCs configured to operate in a time-interleaved manner;
a sampling circuit configured to receive an analog input signal of the ADC, wherein the sampling circuit is common to all sub ADCs; and
a test signal generation circuit configured to generate a test signal for calibration of the ADC; wherein the sampling circuit has a first input configured to receive the analog input signal and a second input configured to receive the test signal; and the sampling circuit comprises an amplifier circuit and a first feedback switch connected between an output of the amplifier circuit and an input of the amplifier circuit, wherein the first feedback switch is configured to be closed during a first clock phase and open during a second clock phase, which is non-overlapping with the first clock phase;

the sampling circuit comprises an input circuit comprising one or more capacitors, each having a first node and a second node;

the sampling circuit comprises sampling switches connecting the first and second inputs with nodes of capacitors in the input circuit to sample the analog input signal and the test signal represented as electrical charges on capacitors in the input circuit;

each of the capacitors in the input circuit is configured to be connected with its second node to said input of the amplifier circuit during the second clock phase; and the sampling circuit comprises a second feedback switch connected between the output of the amplifier circuit and the first node of at least one of the capacitors in the input circuit, wherein the second feedback switch is configured to be closed during the second clock phase and open during the first clock phase, wherein, for each capacitor in the input circuit, the sampling circuit comprises:

a switch connected between the second node of that capacitor and said input of the amplifier circuit, wherein the switch is configured to be closed during the second clock phase and open during the first clock phase.

15. The electronic apparatus of claim 14, wherein the electronic apparatus is a communication apparatus.

16. The electronic apparatus of claim 15, wherein the communication apparatus is a wireless communication device for a cellular communications system.

17. The electronic apparatus of claim 15, wherein the communication apparatus is a base station for a cellular communications system.

* * * * *